United States Patent [19]

Hunter

[11] Patent Number: 4,634,974
[45] Date of Patent: Jan. 6, 1987

[54] DEVICE INCLUDING MOVEABLE SHAFT AND MAGNET FOR SENSING MAGNETIC METAL

[76] Inventor: Rudolf A. Hunter, 6548 E. Conifer St., Agoura Hills, Calif. 91301

[21] Appl. No.: 697,066

[22] Filed: Jan. 31, 1985

[51] Int. Cl.[4] .................. G01N 27/72; G01R 33/12
[52] U.S. Cl. .................................... 324/228; 324/262
[58] Field of Search .............................. 324/228–231, 324/67, 262; 335/205

[56] References Cited

U.S. PATENT DOCUMENTS

| | | |
|---|---|---|
| 2,346,773 | 4/1944 | McBride et al. |
| 2,625,585 | 1/1953 | Krouse .................. 324/228 X |
| 2,637,115 | 5/1953 | Watson ................... 324/228 X |
| 2,670,457 | 2/1954 | Hartman et al. |
| 2,685,216 | 8/1954 | Bannister et al. ......... 324/228 X |
| 2,749,663 | 6/1956 | Lemelson ................. 324/228 X |
| 2,762,970 | 9/1956 | Balduman . |
| 2,843,821 | 7/1958 | Gottlieb . |
| 2,933,679 | 4/1960 | Bray . |
| 3,002,149 | 9/1961 | Christian . |
| 3,293,544 | 12/1966 | Seng . |
| 3,487,346 | 12/1969 | Gardel et al. ............. 324/228 UX |
| 3,845,384 | 10/1974 | Stoutenberg et al. . |
| 4,310,797 | 1/1982 | Butler ..................... 324/228 |

*Primary Examiner*—Gerard R. Strecker
*Attorney, Agent, or Firm*—William P. Green

[57] ABSTRACT

A magnetic sensing device for determining the presence of a non-magnetic portion of an otherwise magnetic metal workpiece, including a body which is adapted to be brought into close proximity to a surface of the workpiece and to be moved along that surface and which carries a magnet movable relative to the body between an active position near the workpiece surface and a retracted position farther away from that surface, with the magnet being retained in its active position near the surface when received opposite a portion of the workpiece which is formed of magnetic metal and being spring urged away from the surface of the workpiece and from the active position of the magnet to its retracted position when the magnet is received opposite a non-magnetic portion of the workpiece, and a manual actuator which is movably carried by the body and has a portion exposed for manual actuation when the body is in its position of use closely proximate the workpiece surface, and which is adapted upon manual actuation to displace the magnet relative to the body to the active position of the magnet, for retention magnetically in that position so long as the magnet remains opposite a portion of the workpiece formed of magnetic material.

4 Claims, 5 Drawing Figures

DEVICE INCLUDING MOVEABLE SHAFT AND MAGNET FOR SENSING MAGNETIC METAL

BACKGROUND OF THE INVENTION

This invention relates to devices for indicating the presence of non-magnetic material in a surface portion of an otherwise magnetic metal workpiece.

In appraising the value and condition of a used automobile, it is helpful to be able to determine whether any significant amount of repair work has been performed on the body of the vehicle. Such repairs, however, are often very difficult to see, since dents can be filled in with plastic material which can be sanded smoothly to any desired contour and then repainted in a manner substantially duplicating the original appearance of the car. Repairs of this type may conceal serious damage to the frame or other parts of the vehicle caused by a major accident.

SUMMARY OF THE INVENTION

The purpose of the present invention is to provide a device which can be utilized for determining whether the body of an automobile or other vehicle has been repaired, and to pinpoint the exact locations of such repairs. The device can be moved manually over the surface of a vehicle body, and will sense the difference between the undamaged metal portions of the body and any areas in which plastic or other non-metallic material covers a damaged region. To attain this result, the device includes a magnet which is carried movably by a body of the device and is adapted for actuation between an active position in which the magnet is retained closely adjacent the surface of the vehicle body when that surface is formed of magnetic material, and a retracted position to which the magnet returns when it is received opposite an area of non-magnetic material. The magnet is desirably urged to its retracted position by a coil spring or other yielding means, and is actuable manually against the tendency of that spring from the retracted position to the active position by a manual actuating element carried by the body of the device at a location accessible for manual actuation while the device is in use. This actuator may be essentially a push button type element which can project outwardly from the device when the magnet is in its retracted position and is pressed inwardly to actuate the magnet to its active position.

A cushioning pad may be carried by the device at an inner side thereof, to contact the surface of the automobile body or other workpiece, in a manner protecting that surface against damage during the testing operation. This pad may have a portion which extends across an opening formed in the body of the device at the inner side of the magnet, to protect the surface of the automobile body against direct contact with the magnet.

BRIEF DESCRIPTION OF THE DRAWING

The above and other features and objects of the invention will be better understood from the following detailed description of the typical embodiment illustrated in the accompanying drawing in which.

DESCRIPTION OF THE PREFERRED EMBODIMENT

Figure 1:
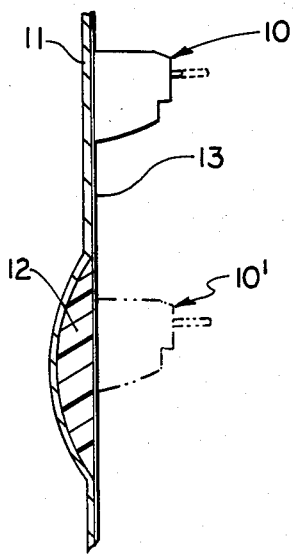
FIG. 1 shows a device embodying the invention as it appears when being used for determining whether a vehicle body has been repaired.

FIG. 1 illustrates a magnetic sensing device 10 embodying the invention as it appears when used to detect a portion of a magnetic metal body 11 of an automobile or other motor vehicle which has been dented and then filled in with nonmagnetic plastic material represented at 12. The surface 13 of the automobile body after repair may be completely smooth and continuous at and adjacent the location of the repair, and may be painted in a manner rendering it difficult if not impossible to detect the damaged area visually.

Figure 2:
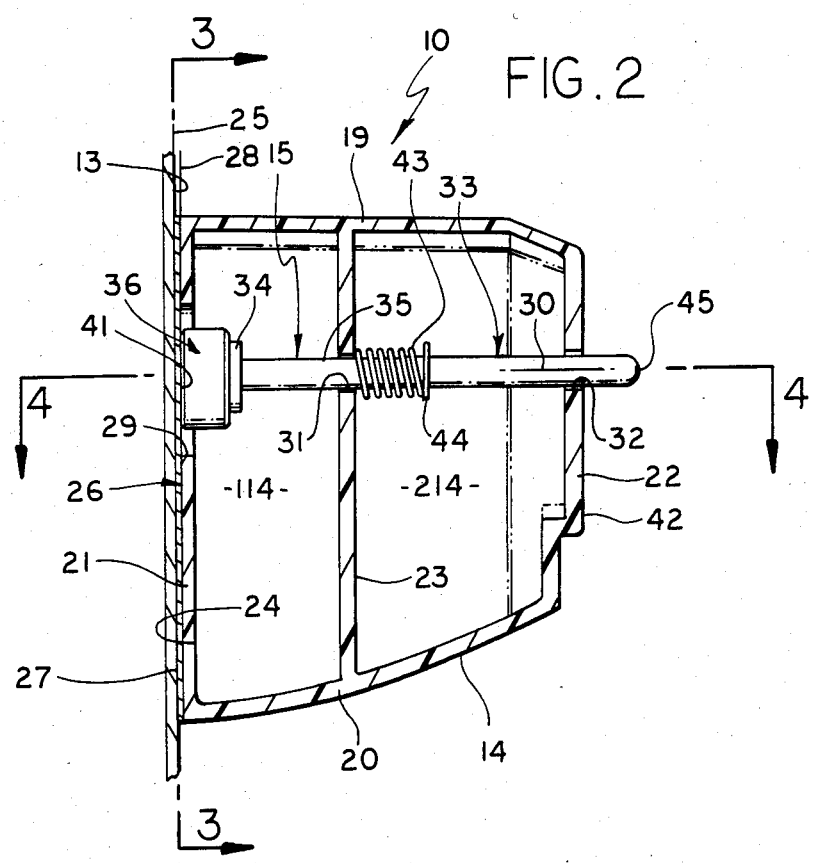
FIG. 2 is an enlarged central vertical section through the device of FIG. 1.
Figure 3:
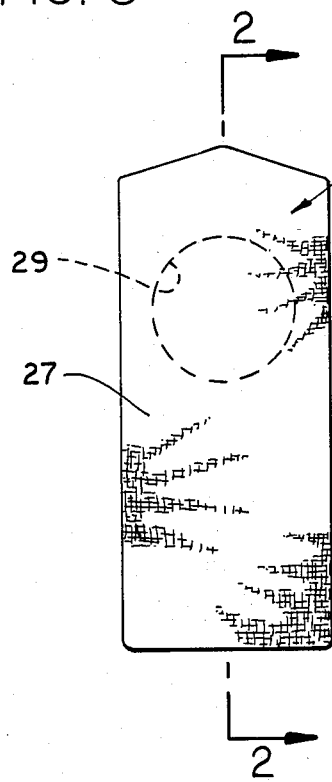
FIG. 3 is an elevation taken on line 3—3 of FIG. 2.
Figure 4:
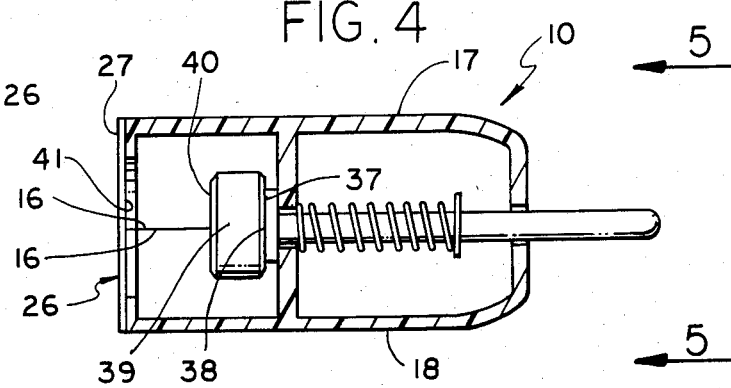
FIG. 4 is a transverse section taken on line 4—4 of FIG. 2.
Figure 5:
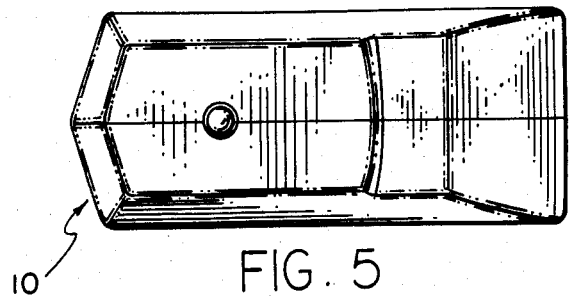
FIG. 5 is an elevation on line 5—5 of FIG. 4.

The device 10 includes a body 14 which is adapted to be held by a user and moved manually over the surface 13 of the automobile body or other workpiece being tested, and which movably carries a magnetically responsive unit 15 actuable between the positions of FIGS. 2 and 4. Body 14 of the device 10 is formed of a non-magnetic material, such as an appropriate essentially rigid resinous plastic material, typically molded to the hollow configuration illustrated in FIGS. 2 and 4 to reduce the weight and cost of the overall device. Preferably, the body is molded in two complementary halves, having edges 16 which meet in a central plane (FIG. 4) and are cemented together in that plane and define two compartments 114 and 214 in the body. The body in its ultimate assembled condition may have two essentially parallel side walls 17 and 18, two front and rear walls 19 and 20 (FIG. 2), an inner wall 21, an outer wall 22, and a partition 23 extending parallel to inner wall 21 and to the major portion of outer wall 22. Wall 21 and partition 23 are preferably planar, as shown, with the inner wall 21 having a surface 24 lying in a plane 25 and adapted to be received closely adjacent and essentially parallel to the surface 13 of the automobile body or other workpiece being tested. A layer of cushioning material 26, which is softer than body 14 and its surface 24, covers that surface and may be adhered to surface 24 across its entire area by a suitable adhesive. As seen in FIG. 3, this sheet of cushioning material and the wall 21 which it covers are preferably approximately rectangular in outline configuration. The cushion 26 may as an example be formed of an appropriate soft felt material, forming a surface 27 of such material which lies in a plane 28 parallel to the previously mentioned plane 25 of body surface 24, so that the only portion of device 10 which contacts the work surface 13 is the surface 27 of cushion 26, to thus prevent damage of any type to the work surface or a layer of paint thereon.

The inner wall 21 of body 14 of the device 10 contains a preferably circular opening 29 which is centered about an axis 30 perpendicular to the inner surface 24 of the body 14 and work contacting surface 27 of cushion 26. Partition 23 and outer wall 22 of body 14 contain aligned circular openings 31 and 32 which may be of a common diameter smaller than that of opening 29, and which are centered about the same axis 30 as is opening 29. The magnetically actuable unit 15 is movably received and guided within openings 31 and 32.

Unit 15 includes a part 33 preferably formed of non-magnetic material, typically a suitable essentially rigid resinous plastic material, and a magnet 36 carried by part 33. The part 33 has a circular inner flange portion 34 disposed transversely of axis 30 and carried by a reduced diameter stem portion 35 which may be externally cylindrical and centered about axis 30 and which is a close fit within openings 31 and 32 to guide part 33 for only axial movement parallel to axis 30 relative to the body 14. Permanent magnet 36 has a surface 37 which may be planar and disposed transversely of axis 30 and secured by an adhesive material to a correspondingly transverse planar surface 38 of flange 34 of part 33. Magnet 36 is circular about axis 30, having a cylindrical peripheral surface 39 centered about that axis and preferably of a diameter substantially less than that of opening 29 in inner wall 21. The magnet can move inwardly into opening 29 to the full line position of FIG. 2, in which an inner surface 40 of the magnet disposed perpendicular to axis 30 is in contact with an opposed planar back surface 41 of the cushioning material 26. In this FIG. 2 position, the relatively thin cushion is thus the only element between the magnet and work surface 13, to enable effective retention of the magnet in that position by attraction to the magnetic material 11 so long as the magnet is received opposite an undented or unrepaired portion of the automobile body as illustrated in FIG. 1. Stem 35 of part 33 projects outwardly beyond the portion of outer surface 42 of body 14 which is adjacent and disposed about opening 32, so that this projecting portion of the stem can function as a push-button for manually actuating the part 33 inwardly from the FIG. 4 position to the FIG. 2 position, and also can function as an indicator by whose position a user can tell visually whether the part 33 is in its FIG. 2 position or its FIG. 4 position.

The magnetic unit 33 is yieldingly urged axially outwardly to its FIG. 4 position by a coil spring 43 disposed about stem 35 at a location between partition 23 and outer wall 22 of body 14. This spring bears at one end against partition 23 and at its opposite end against a flange 44 formed on stem 35. The outward movement of unit 33 may be limited in the FIG. 4 position by engagement of portion 34 of part 33 with partition 23. Flange 44 may take the form of an annular metal washer-like element disposed about the stem and crimped inwardly thereagainst to lock the part 44 in a fixed position relative to the stem.

In using the device, a person places it against the work surface 13 as illustrated in FIG. 1, with the only contact between the device 10 and work surface being through the soft cushioning material 26. While the device is held by a hand of the user in that position, a finger of the hand is brought into contact with the outer push-button and indicator end 45 of part 33 to press that part inwardly from the FIG. 4 position to the FIG. 2 position against the tendency of spring 43. If the magnet 36 is at that time opposite an undamaged steel portion of the vehicle body as illustrated in FIG. 1, the magnetic attraction between magnet 36 and the steel of the automobile body will be sufficient to hold the magnet 36 and the connected part 33 in the FIG. 2 position after the finger pressure is released, with only the layer of cushioning material 26 received between the magnet and the steel of the automobile body. The portion 45 of the movable magnetic unit 15 indicates by its position the fact that the device is opposite a magnetic metal portion of the automobile body. The user may then move device 10 slidably along the surface 13 of the workpiece, while continuously maintaining the cushion 26 in full contact with that surface, and so long as the magnet is opposite an undamaged and unrepaired portion of the vehicle body the indicator 45 will remain in its inner position. However, if the magnet is slid to a position opposite a non-magnetic portion of the automobile body, such as the broken line position represented at 10' in FIG. 1, the attraction between magnet 36 and the workpiece will be reduced to a point at which spring 43 can overcome that attraction and urge unit 15 outwardly to its FIG. 4 position, thus indicating visually by the position of the outer portion 45 of part 33 the fact that a repaired area of the vehicle body has been detected.

Preferably, the device is so constructed that, once the unit 15 has been urged by spring 43 to its retracted position, as an indication of the presence of a non-magnetic portion of the workpiece, the unit 15 will then be retained by the spring in that outwardly projecting position of FIG. 4 even if the device is again slid back to a position opposite an undamaged and unrepaired portion of the workpiece, such as the full line position of FIG. 1. For this purpose, the magnet in its FIG. 4 retracted position is located far enough away from the plane of the workpiece contacting surface 27 of the device to assure a reduction in the attractive force between the magnet and a magnetic surface in contact with the cushion to a value less than the force exerted outwardly (rightwardly) by spring 43 against unit 15 in the FIG. 4 setting. Thus, even if the device is in the full line position of FIG. 1 in direct contact with an undamaged magnetic metal surface, the attraction between magnet 36 and that surface is not great enough to pull the magnet from its FIG. 4 setting to its FIG. 2 active position against the tendency of spring 43. However, when the unit 15 is pressed inwardly by a user's finger to the FIG. 2 position, the increased attraction between the magnet and the metal work surface resulting from the closer proximity of these parts becomes entirely adequate to permanently maintain unit 15 in its active FIG. 2 position so long as the device is in such direct engagement with a magnetic metal element.

While a certain specific embodiment of the present invention has been disclosed as typical, the invention is of course not limited to this particular form, but rather is applicable broadly to all such variations as fall within the scope of the appended claims.

I claim:

1. A magnetic sensing device comprising:
   a hollow body having a first wall at a first side of the body adapted to be moved to a position closely proximate a surface of a workpiece and to be moved along said surface;
   said body having a second wall spaced from said first wall and at a second side of the body opposite said first side;
   a third wall contained in said body at a location between said first and second walls and spaced from each of said first and second walls;
   a permanent magnet contained in said body near said first wall and which is mounted for movement along an axis essentially perpendicular to said first wall and toward and away from said workpiece surface between an active position near said surface and a retracted position farther away from said surface, and which is adapted to be retained magnetically in said active position when the magnet is opposite a portion of the workpiece formed of magnetic material;
   a shaft attached to said magnet for movement therewith and which projects from said magnet along said axis and through aligned openings in said second and third walls and which is slidably guided by said openings for movement with the magnet along said axis and between said active and retracted positions of the magnet;

a spring contained in said body between said second and third walls and yieldingly urging said shaft and magnet axially away from said first wall and said workpiece and to said retracted position of the magnet when the magnet is opposite a portion of the workpiece formed of non-magnetic material;

said shaft having an end portion projecting axially outwardly beyond said second wall of the body at said second side of the body and which exposed for manual depression axially inwardly to manually move said shaft and magnet from said retracted position of the magnet to said active position thereof, and which is returned axially outwardly by said spring when the magnet is opposite a portion of the workpiece formed of non-magnetic material;

said first wall of the body having a surface which is received closely adjacent said surface of the workpiece, and said first wall containing an opening within which said magnet is received in said active position thereof; and a layer of cushioning material carried by said first wall at an outer side thereof and engageable with the workpiece and having a portion bridging across said opening in said first wall and received between the magnet and workpiece.

2. A magnetic sensing device as recited in claim 1, in which said spring is a compression coil spring disposed about said shaft between said second and third walls and acting in opposite directions against said third wall and an enlargement on said shaft.

3. A magnetic sensing device comprising:

a hollow body having a wall at a predetermined side thereof which contains an opening and which is adapted to be moved to a position closely proximate a surface of a workpiece and to be moved along said surface;

a permanent magnet contained movably within said hollow body;

means, including a shaft secured to said magnet, mounting said magnet for movement relative to said body and said wall thereof along a predetermined axis between an active position near said surface of the workpiece and within said opening in said wall and a retracted position offset outwardly from said surface, said shaft having an end portion projecting from said body to the exterior thereof and exposed for manual actuation from the outside of the body to move the magnet from said retracted position to said active position;

yielding means within said body urging said magnet toward said retracted position thereof;

said magnet being adapted to be retained magnetically in said active position within said opening when the magnet is received opposite a portion of a workpiece formed of magnetic material; and a sheet of cushioning material carried by said body at an outer side of said wall for contact with the workpiece and having a portion bridging across said opening in the wall to prevent contact of said magnet with the workpiece.

4. A magnetic sensing device comprising:

a hollow body having a first wall at a first side of the body adapted to be moved to a position closely proximate a surface of a workpiece and to be moved along said surface;

said body having a second wall spaced from said first wall and at a second side of the body opposite said first side;

a third wall contained in said body at a location between said first and second walls and spaced from each of said first and second walls;

a permanent magnet contained in said body near said first wall and which is mounted for movement along an axis essentially perpendicular to said first wall and toward and away from said workpiece surface between an active position near said surface and a retracted position farther away from said surface, and which is adapted to be retained magnetically in said active position when the magnet is opposite a portion of the workpiece formed of magnetic material;

a shaft attached to said magnet for movement therewith and which projects from said magnet along said axis and through aligned openings in said second and third walls and which is slidably guided by said openings for movement with the magnet along said axis and between said active and retracted positions of the magnet;

a spring contained in said body yieldingly urging said shaft and magnet axially away from said first wall and said workpiece and to said retracted position of the magnet when the magnet is opposite a portion of the workpiece formed of non-magnetic material;

said shaft having an end portion projecting axially outwardly beyond said second wall of the body at said second side of the body and which is exposed for manual depression axially inwardly to manually move said shaft and magnet from said retracted position of the magnet to said active position thereof, and which is returned axially outwardly by said spring when the magnet is opposite a portion of the workpiece formed of non-magnetic material;

said first wall of the body having a surface which is received closely adjacent said surface of the workpiece, and said first wall containing an opening within which said magnet is received in said active position thereof; and a layer of cushioning material carried by said first wall at an outer side thereof and engageable with the workpiece and having a portion bridging across said opening in said first wall and received between the magnet and workpiece.

* * * * *